United States Patent [19]

Imai et al.

[11] Patent Number: 4,939,214

[45] Date of Patent: Jul. 3, 1990

[54] FILM COMPRISED OF AT LEAST ONE MONOMOLECULAR LAYER AND PROCESS FOR ITS PREPARATION USING A HIGHER ALKYL AMINE

[75] Inventors: Yoshio Imai, 9-2, Nakamagome 1-chome, Ota-ku, Tokyo; Taro Hino, 37-18, Shinoharanishi-machi, Kohoku-ku, Yokohama-shi, Kanagawa-Ken; Mitsumasa Iwamoto, Tokyo; Masa-aki Kakimoto, Yokohama; Masa-aki Suzuki; Toru Konishi, both of Tokyo, all of Japan

[73] Assignees: Mitsubishi Kasei Corporation; Yoshio Imai, both of Tokyo; Taro Hino, Yokohama, all of Japan

[21] Appl. No.: 930,910

[22] Filed: Nov. 17, 1986

[30] Foreign Application Priority Data

Nov. 18, 1985 [JP] Japan .................. 60-258203

[51] Int. Cl.$^5$ ............................... C08G 73/10
[52] U.S. Cl. ........................ 525/426; 525/436; 528/125; 528/128; 528/172; 528/173; 528/183; 528/185; 528/188; 528/220; 528/226; 528/229; 528/352; 528/353; 427/434.3; 264/298; 264/331.19; 264/331.21; 264/212; 264/216
[58] Field of Search ............... 525/436, 426; 528/125, 528/128, 172, 173, 183, 185, 188, 220, 226, 229, 352, 353

[56] References Cited

FOREIGN PATENT DOCUMENTS 0247637 2/1987 European Pat. Off. ........... 525/436

OTHER PUBLICATIONS

Suzuki et al, *Chemistry Letters*, pp. 395-398.
Kakimoto et al, *Chemistry Letters*, pp. 823-826.
Chem Abstracts, vol. 102, No. 26, Jul. 1, 1985, p. 6 abstract No. 221283w.
Chem Abstracts, vol. 100, No. 10, Mar. 5, 1984, p. 10, abstract No. 68897m.

*Primary Examiner*—John Kight
*Assistant Examiner*—Frederick Krass
*Attorney, Agent, or Firm*—Oblon, Spivak, McClelland, Maier & Neustadt

[57] ABSTRACT

A film comprised of at least one monomolecular layer composed essentially of a polyimide having repeating units of the formula:

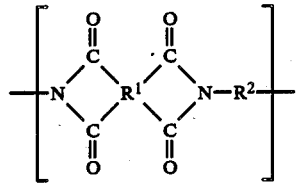

wherein $R^1$ is a tetravalent organic group and $R^2$ is a bivalent organic group.

8 Claims, 20 Drawing Sheets

FILM COMPRISED OF AT LEAST ONE MONOMOLECULAR LAYER AND PROCESS FOR ITS PREPARATION USING A HIGHER ALKYL AMINE

BACKGROUND OF THE INVENTION

1. Field of the Invention

The present invention relates to a film comprised of at least one monomolecular layer composed essentially of a polyimide, and a process for its preparation.

2. Description of the Prior Art

Polyimide films have high heat resistance and insulating properties, and have been widely used for electronic materials such as liquid crystal products or semiconductor devices or as permselective membranes such as membranes for enriching hydrogen.

However, most of polyimide films so far prepared had a thickness of about 0.1 μm at the minimum, and the thickness was not necessarily uniform. It is necessary to prepare a thinner and more uniform film to obtain higher performance electronic materials or permselective membranes. However, there has been no practical method for the preparation of a thin film having a thickness of less than about 0.1 μm, whereby it has been difficult to utilize polyimide films on a commercial scale.

SUMMARY OF THE INVENTION

Under these circumstances, the present inventors have conducted extensive researches to obtain a polyimide film having a thickness of not more than about 1 μm, particularly not more than about 0.1 μm and having a uniform thickness, and have finally accomplished the present invention.

The present invention provides a film comprised of at least one monomolecular layer composed essentially of a polyimide having repeating units of the formula:

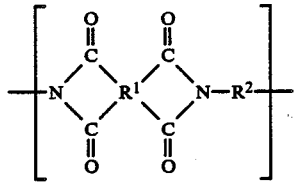

wherein $R^1$ is a tetravalent organic group and $R^2$ is a bivalent organic group.

The present invention also provides a process for preparing such a film, which comprises spreading on a water surface an organic solvent solution of a polyamic acid and an amine having a higher alkyl group, forming on a substrate film comprised of at least one monomolecular layer of a polyamic acid derivative, and then treating the film for conversion to a polyimide.

BRIEF DESCRIPTION OF THE DRAWINGS

Each of FIGS. 1 and 7 to 15 shows a relation between the surface pressure and the area per molecule of a monomolecular built-up film of a polyamic acid derivative according to the present invention.

Each of FIGS. 2 and 16 shows a relation between the number of layers of a multiple layer film of a polyamic acid derivative and the absorbance (at 258 nm in FIG. 2, and at 204 nm in FIG. 16).

Figure 3:
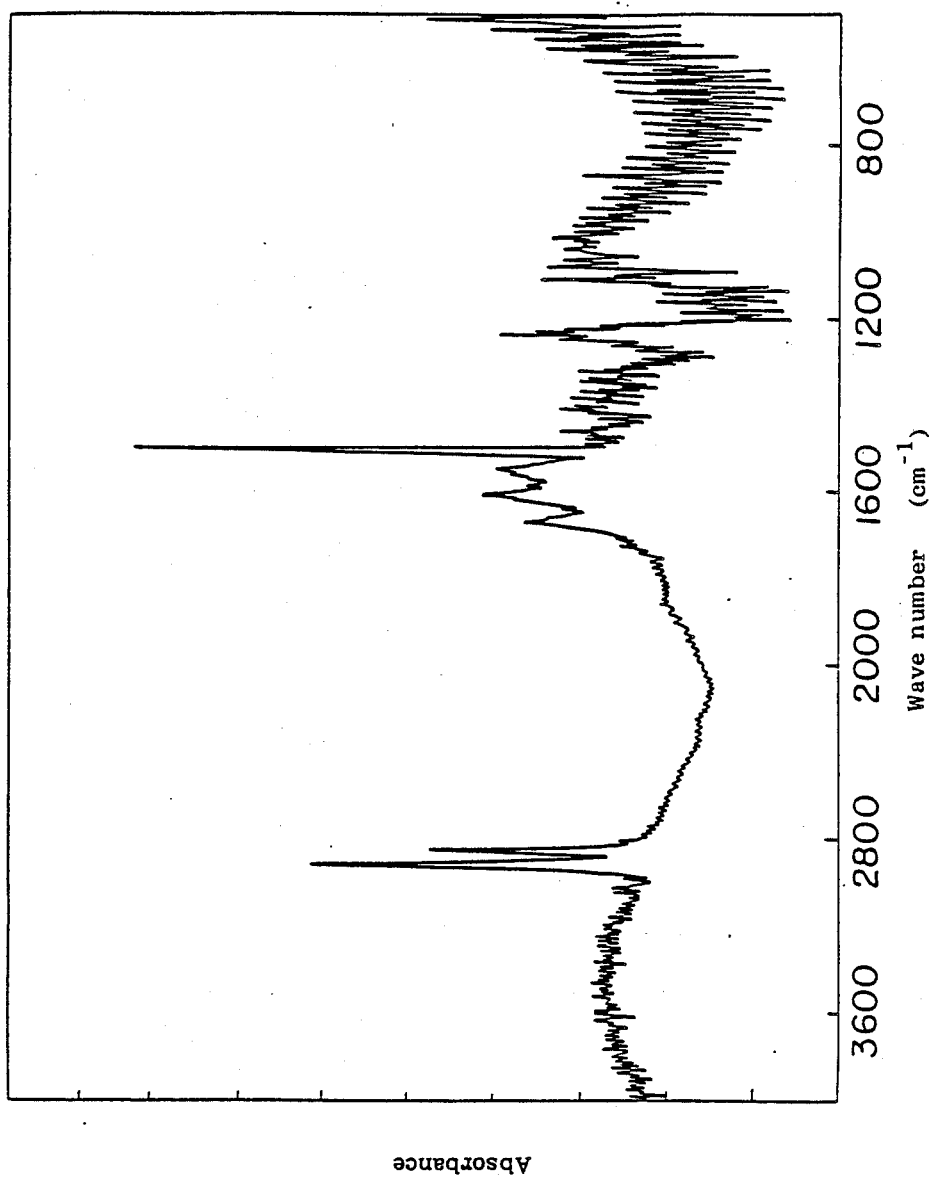
Figure 17:
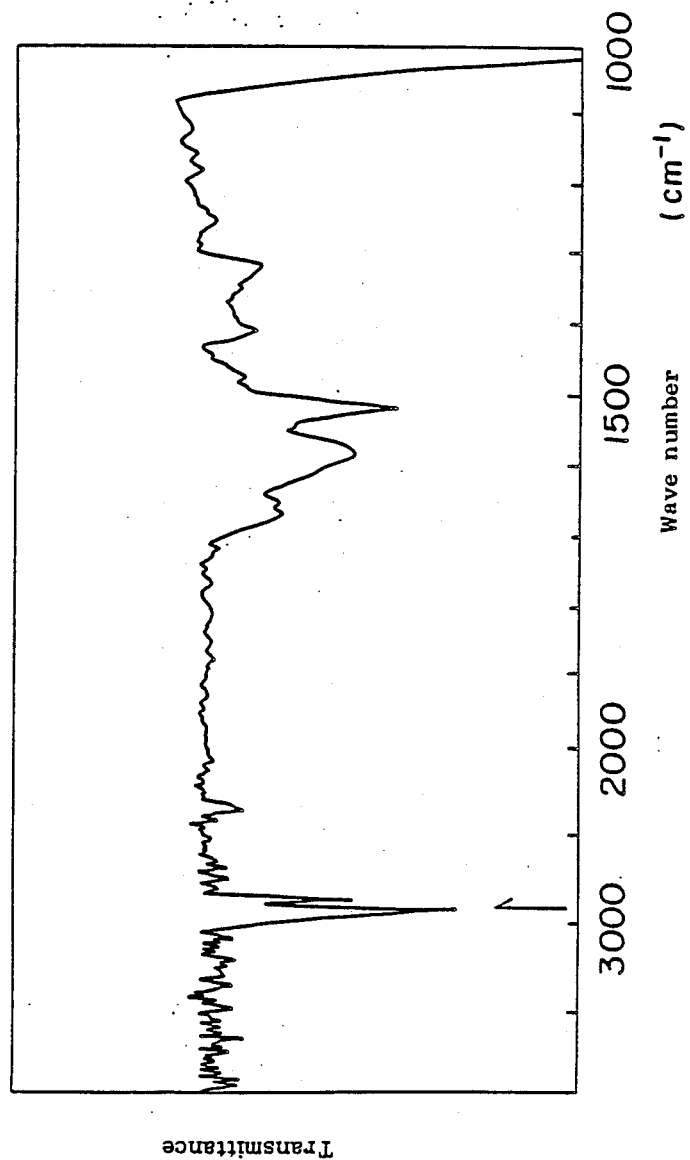

Each of FIGS. 3 and 17 shows a FT-IR spectrum of a monomolecular built-up film of a polyamic acid derivative.

Figure 4:
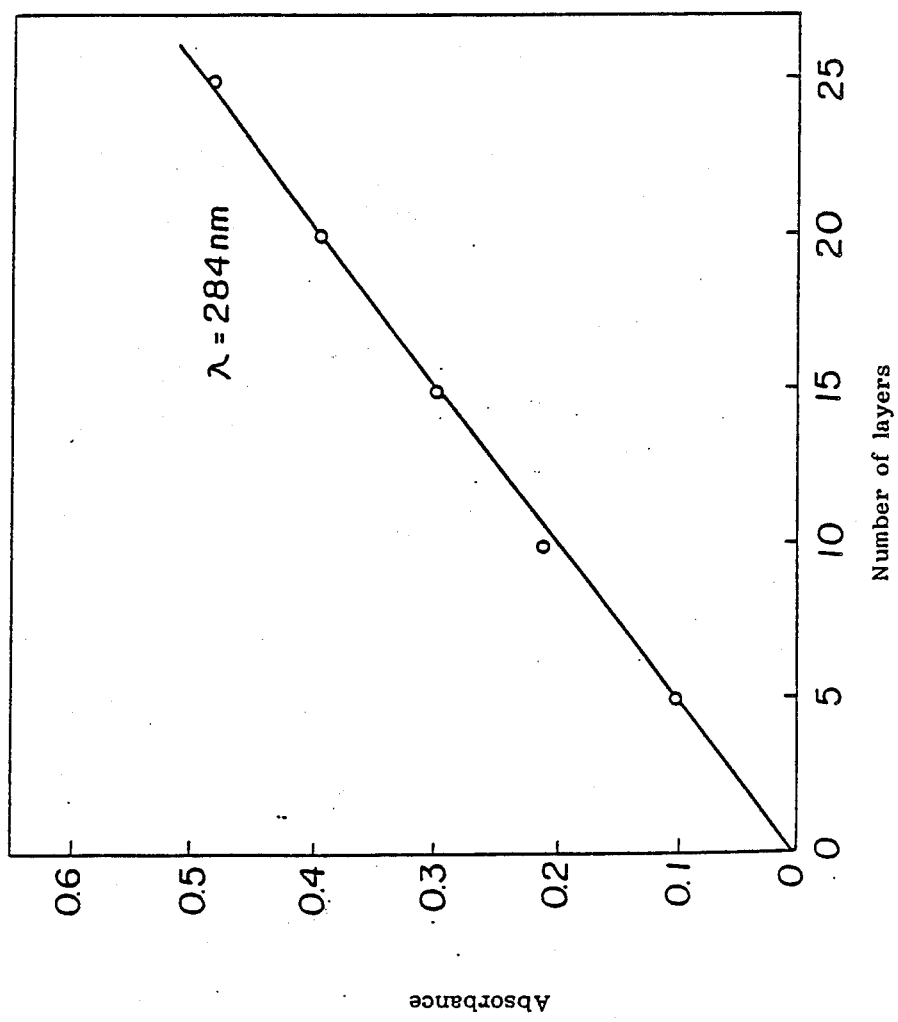
Figure 18:
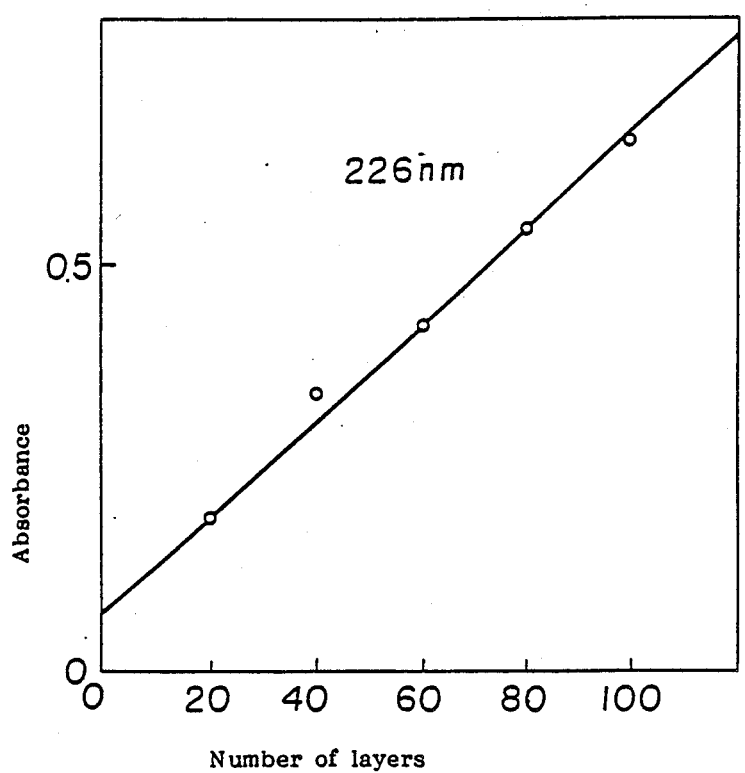

Each of FIGS. 4 and 18 shows a relation between the number of layers of a multiple layer film of a polyimide and the absorbance (at 284 nm in FIG. 4, and at 226 nm in FIG. 18).

Figure 5:
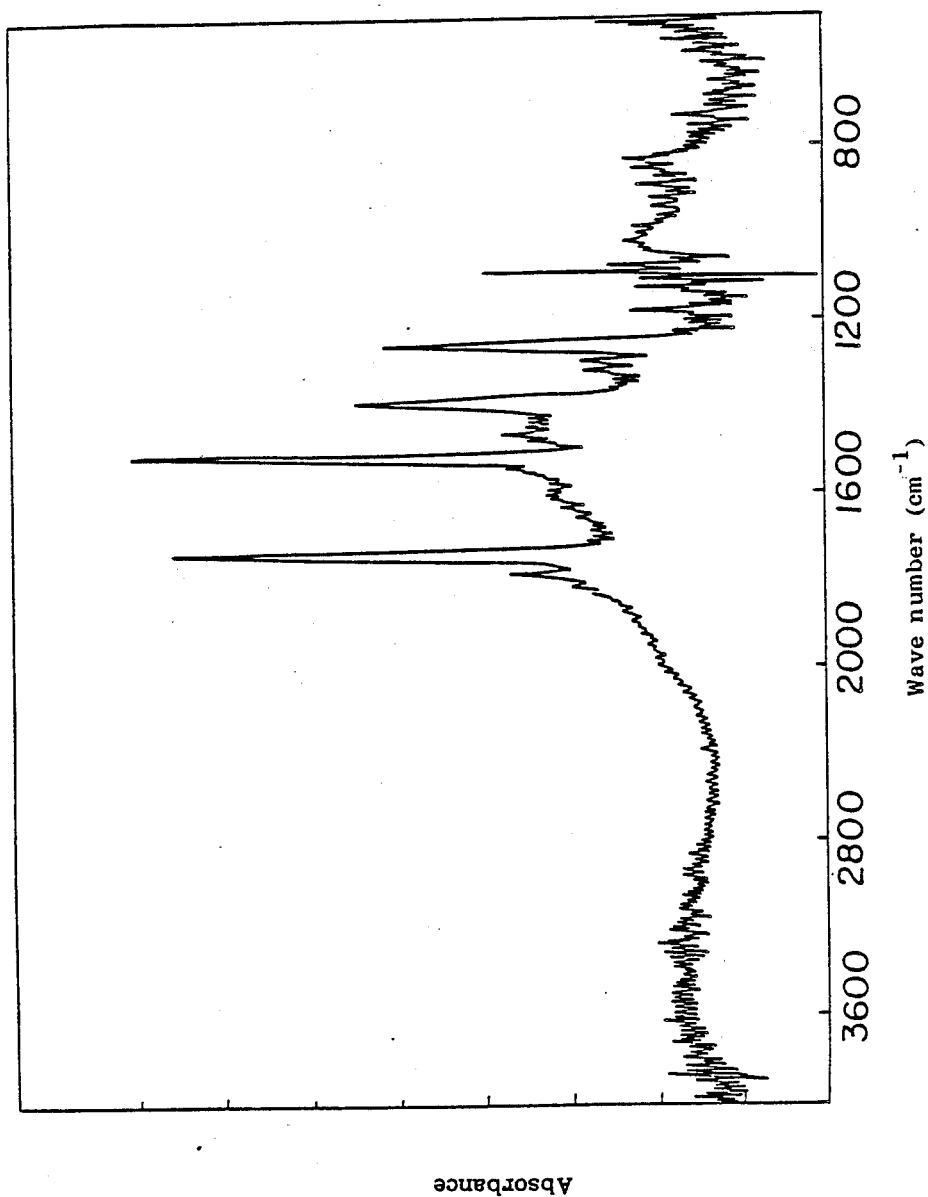
Figure 19:
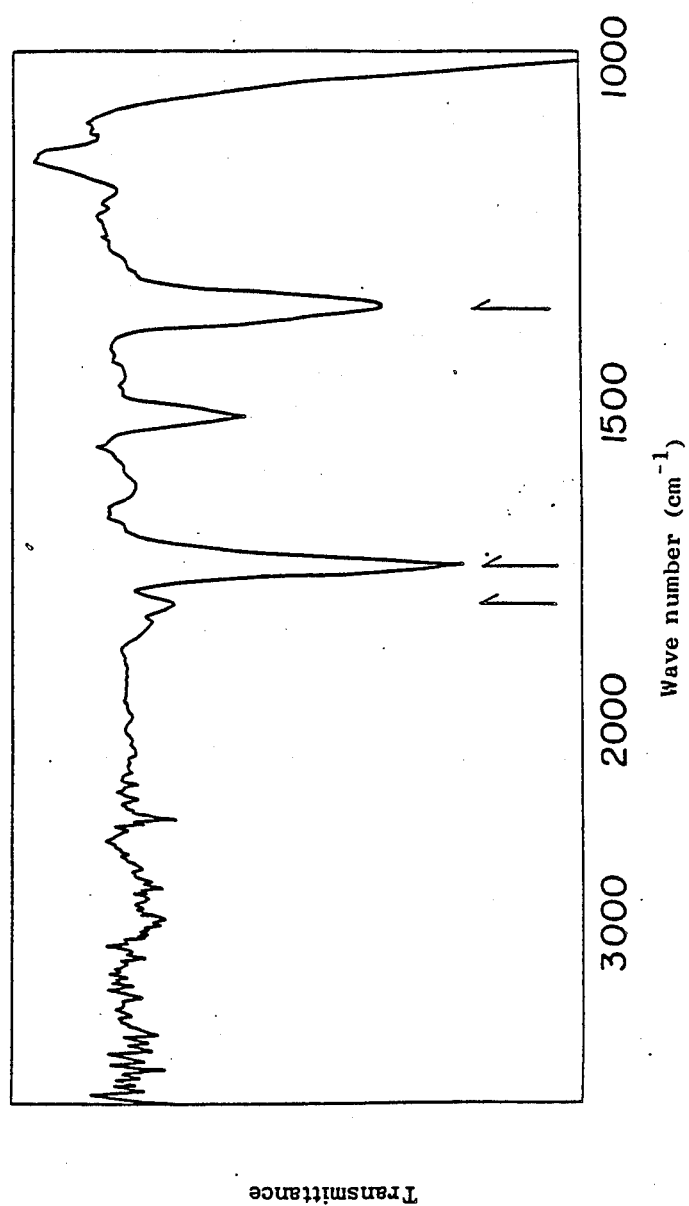

Each of FIGS. 5 and 19 shows a FT-IR fourier transform-infrared spectroscopy spectrum of a multiple layer film of a polyimide.

Figure 6:
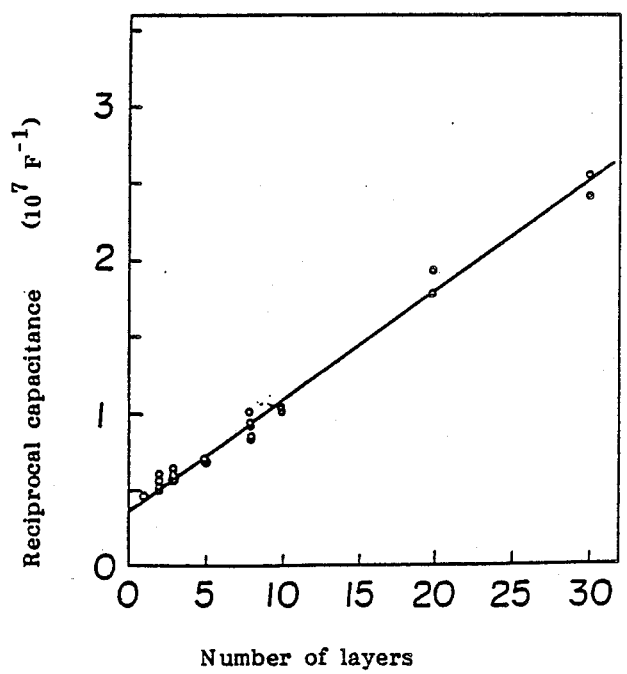
Figure 20:
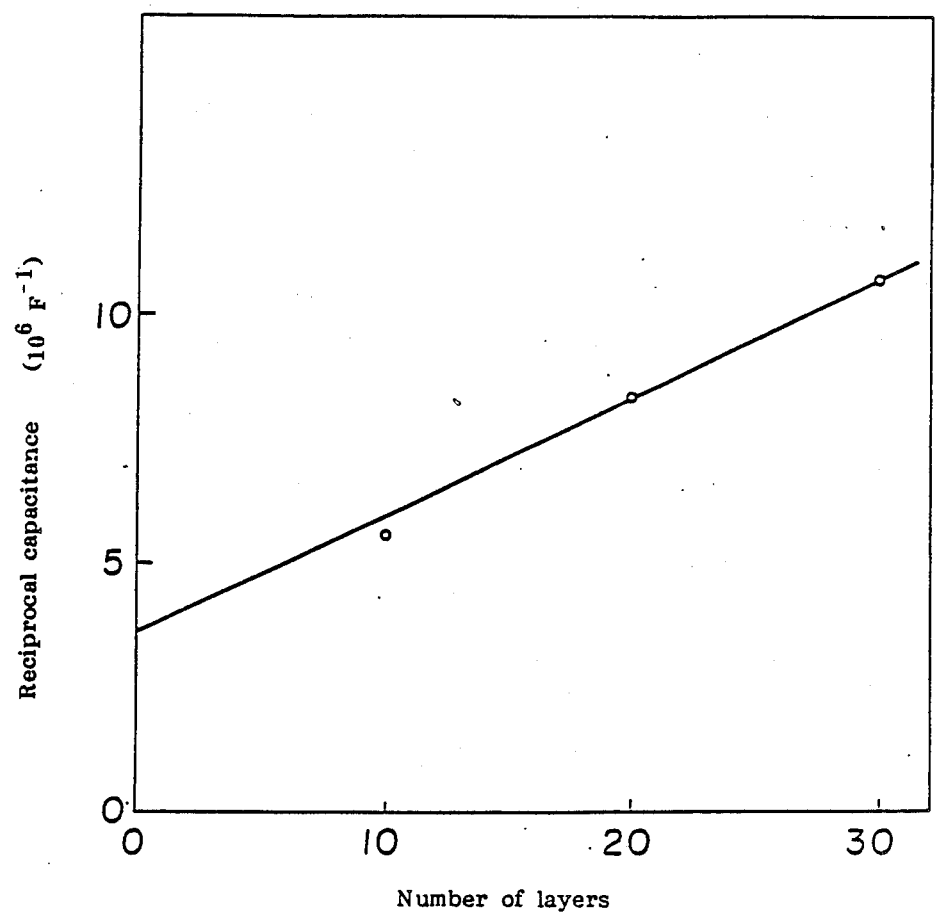

Each of FIGS. 6 and 20 shows a relation between the reciprocal capacitance and the number of layers of a multiple layer film of a polyimide.

DETAILED DESCRIPTION OF THE PREFERRED EMBODIMENTS

The polyamic acid used for the preparation of the a film comprised of at least one monomolecular layer of the present invention is represented by the formula:

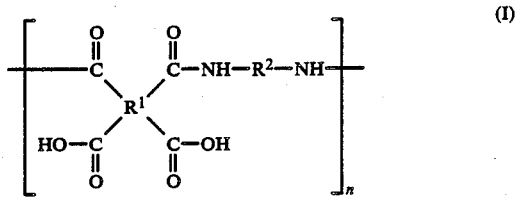

wherein $R^1$ is a tetravalent organic group, $R^2$ is a bivalent organic group and n is an integer of at least 10.

The polyamic acid of the formula I is prepared by a conventional method for the preparation of a polyamic acid from a tetracarboxylic dianhydride of the formula:

wherein $R^1$ is as defined above with respect to the formula I, and a diamine of the formula:

wherein $R^2$ is as defined above with respect to the formula I.

In the above formulas, $R^1$ is a tetravalent aromatic organic group which may be selected from the group consisting of

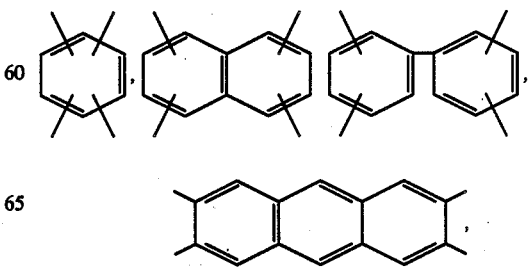

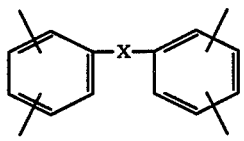

wherein X is a bivalent group selected from the group consisting of

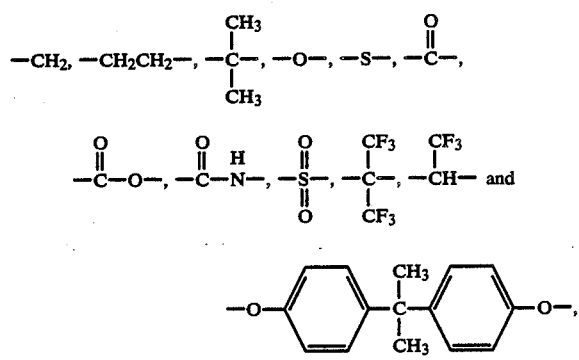

or a substituted derivative thereof.

The tetracarboxylic dianhydride of the formula III includes dianhydrides of tetracarboxylic acids such as pyromellitic acid,
3,4,3′, 4′-benzophenonetetracarboxylic acid,
3,4,3′, 4′-biphenyltetracarboxylic acid,
2,3,3′, 4′-biphenyltetracarboxylic acid,
2,3,6,7-naphthalenetetracarboxylic acid,
bis(3,4-dicarboxyphenyl)methane,
bis(3,4-dicarboxyphenyl)ether,
bis(3,4-dicarboxyphenyl)sulfone,
2,2-bis(3,4-dicarboxyphenyl)propane and butanetetracarboxylic acid.

On the other hand, $R^2$ is usually selected from bivalent aromatic groups such as phenylene, naphthylene, biphenylene and a biphenylene derivative wherein the two phenylene groups are connected by a bivalent group X as defined above with respect to $R^1$. These aromatic groups may contain a functional group such as a photosensitive group (e.g. an acryl group, an acrylamido group or cinnamylamido group).

The diamine of the formula IV includes, for example, m-phenylenediamine, p-phenylenediamine, 4,4′-diaminobiphenyl, 3,3′-methylenedianiline, 4,4′-methylenedianiline, 4,4′-ethylenedianiline, 4,4′-isopropylidenedianiline, 3,4′-oxydianiline, 4,4′-oxydianiline, 4,4′-thiodianiline, 3,3′-carbonyldianiline, 4,4′-carbonyldianiline, 3,3′-sulfonyldianiline, 4,4′-sulfonyldianiline, 1,4-naphthalenediamine, 1,5-naphthalenediamine and 2,6-naphthalenediamine.

The amine having a higher alkyl group to be used in the present invention, may be represented by the formula:

$$R^3-N-R^4 \quad \text{(II)}$$
$$\phantom{R^3-N-}R^5$$

wherein each of $R^3$, $R^4$ and $R^5$ is a hydrogen atom or an organic group, provided that two of them may, together with the adjacent nitrogen atom, form a cyclic ring, and at least one of them is a higher alkyl group.

The organic group includes an alkyl group which may be substituted by an aromatic or alicyclic hydrocarbon group, and an unsaturated group such as an alkenyl group or an alkynyl group. In these organic groups, a part of carbon atoms of e.g. an alkyl group, may be substituted by another linking group such as O, S, CO or an ester group.

When two of $R^3$, $R^4$ and $R^5$ form a cyclic ring, such a ring may be a 3- to 7-membered cyclic ring.

The higher alkyl is preferably an alkyl group having from 8 to 40 carbon atoms such as an octyl group, a decyl group, a dodecyl group, a hexadecyl group, an eicosyl group, a docosyl group, a tetracosyl group, an octacosyl group, a triacontyl group or a pentatriacontyl group. However, a part of carbon atoms in such an alkyl group may be substituted by another linking group such as O, S, CO or an ester group. In such a case, the total number of the carbon atoms and the linking group is preferably selected within a range of from 8 to 40. The higher alkyl group may be branched, and may contain a double bond or a triple bond. As such a substituted alkyl group, there may be mentioned, for instance, with respect to an octadecyl group, an oxaoctadecyl group, a thiaoctadecyl group, an octadecenyl group or octadecynyl group.

At least one of $R^3$, $R^4$ and $R^5$ is required to be the above-mentioned higher alkyl group. Usually, only one of them may be such a higher alkyl group. Further, when two of them forms a cyclic ring as mentioned above, the higher alkyl group may be contained in such a ring.

In the present invention, firstly, an organic solvent solution of the above-mentioned polyamic acid and amine, is spread on a water surface, and a film comprised of at least one monomolecular layer of a polyamic acid derivative is formed on a substrate.

For instance, an organic solvent solution of a polyamic acid of the formula I is mixed with an amine of the formula II, and the solution thus obtained is spread on a water surface, and then the monomolecular film is formed on a substrate. The polyamic acid to be used here, may be the one which was once isolated. Namely, such an isolated polyamic acid is dissolved again in a suitable organic solvent for use. However, a polymerization reaction solution obtained by reacting a tetracarboxylic dianhydride of the formula III with a diamine of the formula IV in an organic solvent, may be used as it is, and may be diluted with an organic solvent to adjust it to be suitable for the subsequent spreading. The organic solvent to be used for the polymerization reaction of the tetracarboxylic dianhydride of the formula III with the diamine of the formula IV, includes N,N-dimethylformamide, N,N-dimethylacetamide, N-methyl-2-pyrrolidone, and 2,2′-dimethoxyethyl ether. In any case, n representing the degree of polymerization of the polyamic acid is preferably at least 10. If n is smaller than this, there will be a possibility that the product will not function as a film. The organic solvent to be used for spreading the organic solvent solution of the polyamic acid derivative, includes a hydrocarbon solvent such as hexane or octane, an aromatic solvent such as benzene, toluene or xylene, a chlorinated hydrocarbon solvent such as dichloromethane, chloroform or carbon tetrachloride and an ether solvent such as diethyl ether or dibutyl ether. The organic solvent is required to be substantially non-miscible with water. Further, these organic solvents may be used in combination with a polar solvent such as dimethylformamide, N,N-dimethylacetamide, N-methyl-2-pyrrolidone or dimethyl sulfoxide. In such a case, the organic solvent substantially non-miscible with water should be at least 10% by volume in the total solvent. Otherwise, the spreading on a water surface becomes difficult.

With respect to the proportions of the polyamic acid and the amine, the amine is used usually in an amount of at least ½ mol relative to the polyamic acid in order to obtain a self-supporting property i.e. a surface pressure suitable for the formation of a monomolecular film on a substrate (at least about 10 dyne/cm, usually at least 15 dyne/cm), and preferably used in an equimolar amount. The concentration of the polyamic acid and amine in the organic solvent, may suitably be selected depending upon the types of the polyamic acid, the amine and the solvent, etc. For instance, the concentration is usually within a range of from 0.1 to 10 mmol/liter. Additional materials for the monomolecular film other than the above-mentioned components, may optionally be incorporated so long as the properties of the monomolecular film of the present invention are not substantially affected.

As the substrate, there may be employed a ceramics such as quartz or glass, a metal such as aluminum, copper or iron, a semiconductor such as silicon or galium-arsenic, or a plastic film such as a polyimide film or a polysulfone film. These substrate must be substantially insoluble in water. For the formation of a monomolecular film on the substrate, it is convenient to use a thin layer-forming device in accordance with so-called Langmuir-Blodgett technique (e.g. Contemp. Phys 25, 109, 1984). The film thickness may optionally be adjusted by changing the number of layers deposited depending upon the particular purpose of the film.

In the present invention, the a film comprised of at least one monomolecular layer of a polyamic acid derivative thus formed on the substrate, is treated for conversion to a polyimide to obtain a thin film of the polyimide. The treatment for conversion to a polyimide may be conducted by either one of heat treatment and chemical treatment or by a combination of both methods. In heat treatment, the substrate on which the a film comprised of at least one monomolecular layer of the polyamic acid derivative is formed, is gradually heated to a temperature of 300° C. This heat treatment is preferably conducted under an inert gas atmosphere such as nitrogen or argon. In chemical treatment, the substrate on which the a film comprised of at least one monomolecular layer of the polyamic acid derivative is formed, is immersed in an organic solvent solution containing a carboxylic acid anhydride for conversion to a polyimide. The acid anhydride to be used here, may be, for instance, acetic anhydride, propionic anhydride or butyric anhydride. It is effective to employ a base such as pyridine in combination with such an acid anhydride. The organic solvent useful for this process is selected from organic solvents which do not substantially dissolve the polyamic acid derivative deposited on the substrate. As such organic solvents, there may be mentioned a hydrocarbon solvent such as hexane or octane, an aromatic solvent such as benzene, toluene or xylene, a chlorinated hydrocarbon solvent such as dichloromethane, chloroform or carbon tetrachloride, and an ether solvent such as diethyl ether or dibutyl ether. The immersion in the organic solvent solution of the carboxylic acid anhydride is usually preferably conducted for from 10 minutes to 24 hours.

The monomolecular membrane or monomolecular built-up membrane thus obtained is composed essentially of a polyimide having repeating units of the formula:

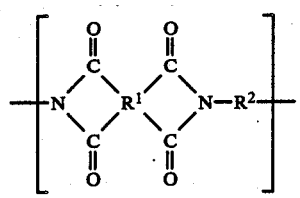

wherein $R^1$ and $R^2$ are as defined above with respect to the formula I. The number of built-up layers is determined by selecting the number of deposition of the a film comprised of at least one monomolecular layer of the polyamic acid derivative.

Now, the present invention will be described in further detail with reference to Examples. However, it should be understood that the present invention is by no means restricted to these specific Examples.

EXAMPLE 1

Preparation of a polyamic acid solution:

1.00 g (5 mmol) of 4,4'-oxydianiline was dissolved in 20 ml of N,N-dimethylacetamide, and 1.09 g (5 mmol) of pyromellitic dianhydride was added thereto. This solution was stirred at 12°–15° C. for one hour and at 20°–25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 1.26. 0.4 ml of the solution of the polyamic acid was diluted with 49.6 ml of N,N-dimethylacetamide and 50.0 ml of benzene to obtain a solution for the preparation of a monomolecular film. This solution had a concentration of 1 mmol/liter.

Figure 1:
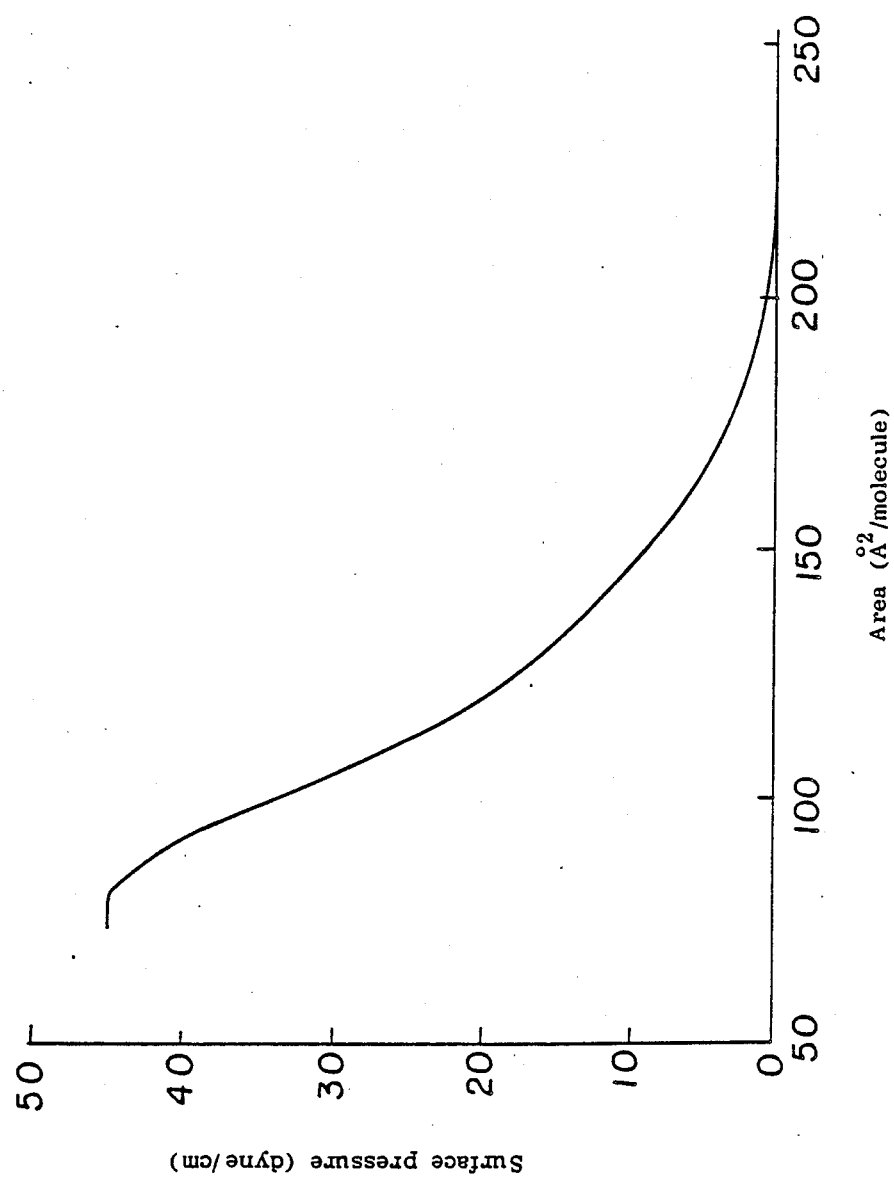
Figure 2:
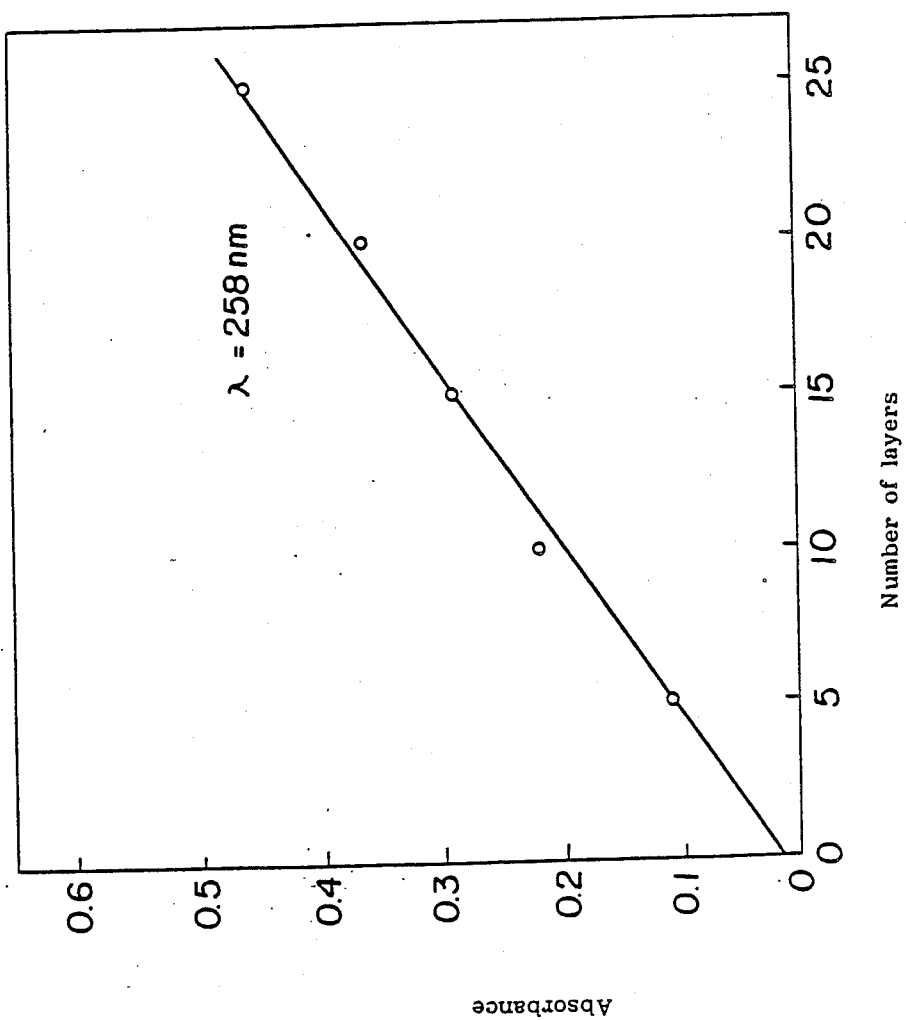

Preparation of a monomolecular film of a polyamic acid derivative:

0.3 ml of the polyamic acid solution prepared in the above step was mixed with 0.6 ml of a solution (1 mmol/liter) of hexadecyldimethylamine in a 1:1 mixture of benzene and N,N'-dimethylacetamide. Then, 100 microliter of this solution was spread on the surface of pure water. The surface pressure-area curve of the monomolecular film of the polyamic acid derivative thus obtained, is shown in FIG. 1. Then, the thin film on the water surface was deposited on a quartz plate at a surface pressure of 25 dyne/cm by a vertical dipping method (Langmuir-Blodgett technique). FIG. 2 shows the relationship between the number of layers of the monomolecular film of the polyamic acid derivative deposited on the quartz plate and the absorbance at 258 nm in the ultraviolet absorption spectrum. This graph shows a linear relation, which indicates that the deposition or building-up is satisfactory. Further, the pattern of the absorption spectrum was the same as that of a thick film of the same polyamic acid derivative formed separately by a conventional solvent casting method. From the scanning type electron microscopic photograph of a thin film of 20 layers deposited on a glass plate, no distinct cracks or voids were observed. FIG. 3 shows a trasmission FT-IR spectrum of the polyamic acid derivative deposited on a silicon wafer. The pattern of this spectrum was the same as that of a thick film of the same polyamic acid derivative formed separately by a usual solvent casting method. From the ellipsometry, the refractive index was found to be 1.25, and the interlaminar distance was 16 Å.

Preparation of a multiple layer film of a polyimide:

The quartz plate on which the polyamic acid derivative was deposited as mentioned above, was immersed in a solution obtained by mixing acetic anhydride, pyridine and benzene in a ratio of 1:1:3, for 12 hours. As shown in FIG. 4, the number of layers and the absorbance at 284 nm are in a linear relation, and thus, the built-up structure of the multiple layer film of the polyamic acid derivative prepared in the above step, is reflected directly to this multiple layer film of the polyimide. Further, the pattern of the absorption spectrum was the same as that of a thick film of the polyimide separately prepared by forming a thick film of the same polyamic acid derivative by a usual solvent casting method and dipping the thick film in the above-mentioned solvent mixture of acetic anhydride, pyridine and benzene. This indicates that the built-up film of the polyamic acid derivative was converted to a built-up film of a polyimide, and no peeling of the film took place during the process for conversion. Further, FIG. 5 shows a transmission FT-IR spectrum of the polyimide deposited on a silicon wafer. The pattern of the spectrum was the same as that of a thick film of the polyamide prepared separately by forming a thick film of the same polyamic acid derivative by a usual solvent casting method and immersing the thick film in the above-mentioned solvent mixture of acetic anhydride, pyridine and benzene. With the polyimide multiple layer film obtained from the polyamic acid derivative built-up film used for the scanning type electron microscopic inspection in the previous step, no distinct cracks or voids were observed from the scanning electron microscopic photograph. From the inspection by the X-ray diffraction, the interlayer distance was found to be about 4 Å. The thickness of the polyimide multiple layer film of 100 layers, was measured by a feeler method and found to be 420 Å, which was the same as the value obtained by the X-ray diffraction. Further, from the ellipsometry, the refractive index was found to be 1.68, and the interlayer distance was 4.5 Å.

Then, in the same manner as above, a polyimide monomolecular film was deposited on a substrate prepared by vapor depositing aluminum on a glass plate, and aluminum was further vapor-deposited thereon as an upper electrode, whereupon the electric capacitance of the polyimide multiple layer film was measured. The results are shown in FIG. 6, from which it is evident that the number of layers and the reciprocal of the electric capacitance are in a proportional relationship, and the number of layers and the film thickness are proportional. Further, from the slope, the dielectric constant is obtainable. When 4 Å A obtained from the X-ray diffraction is used as the film thickness, the dielectric constant is determined to be 3.3. This value substantially agrees to the value reported on the corresponding polyimide film.

EXAMPLE 2

Figure 7:
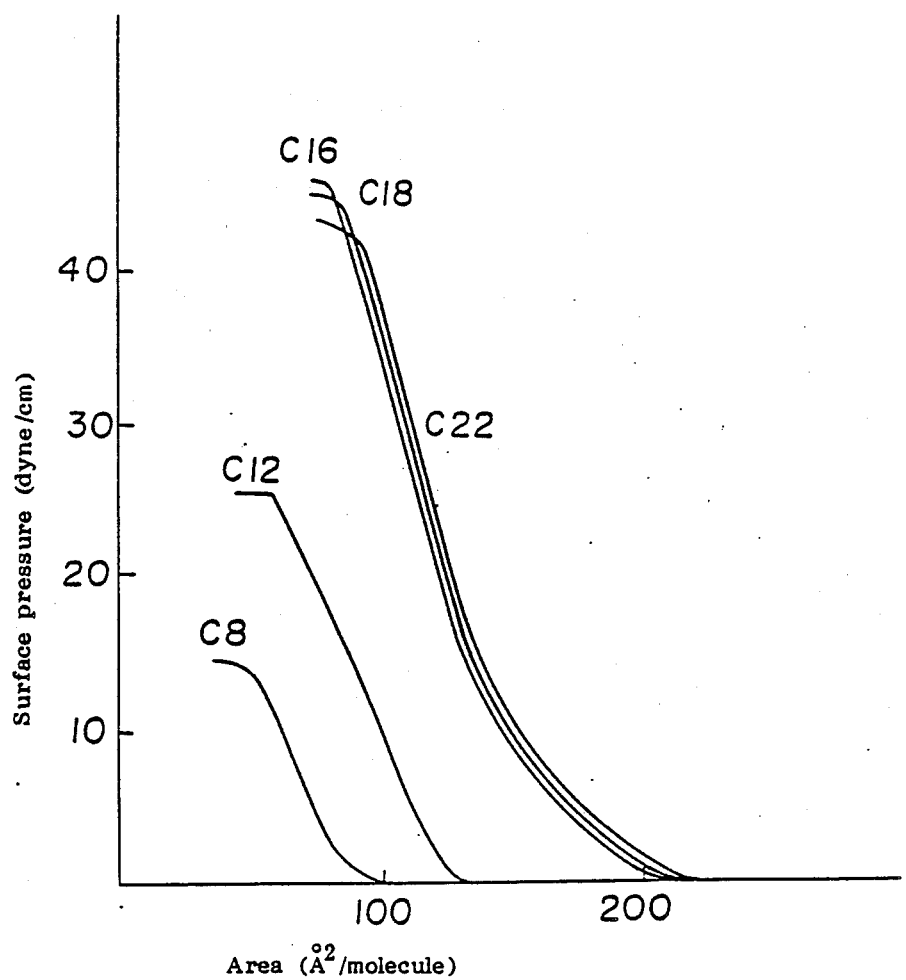
Figure 8:
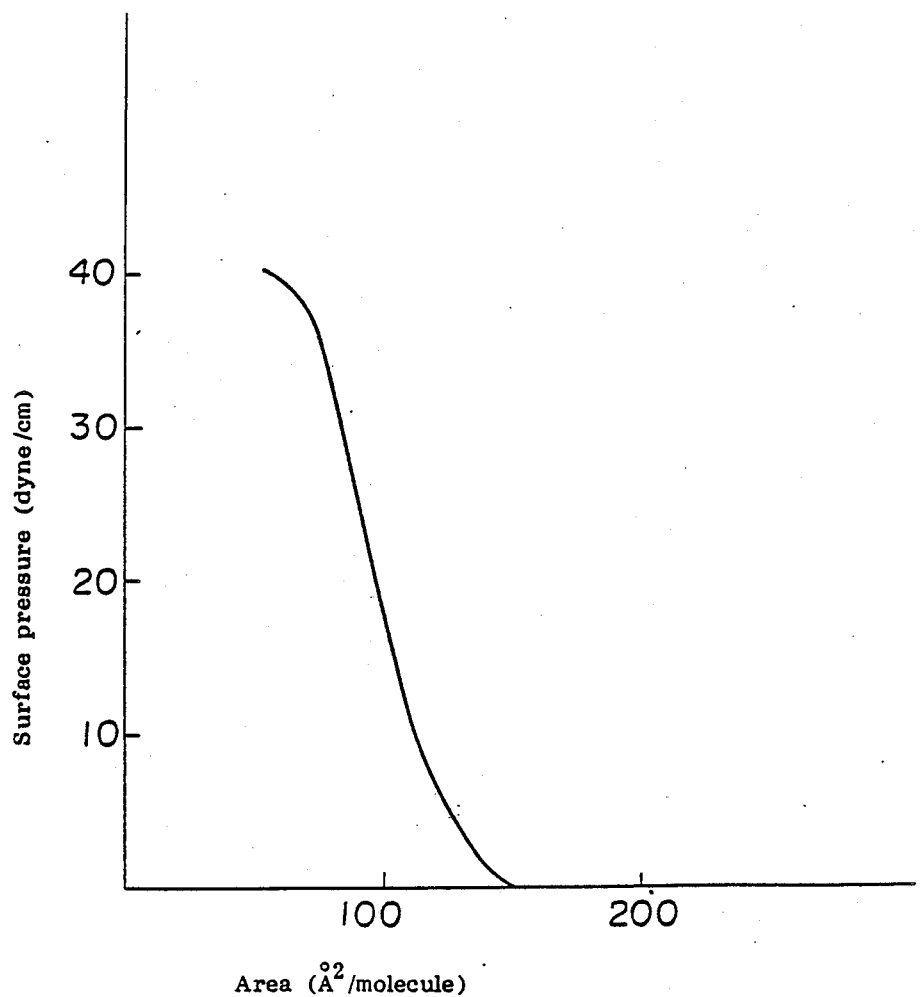

A surface pressure-area curve was obtained under the same conditions as in Example 1 by using a mixture obtained by mixing the polyamic acid and an amine in a molar ratio of 1:2. In FIG. 7, the type of the amine used was varied. Namely, the curves represent, from right to left, docosyldimethylamine, octadecyldimethylamine, hexadecyldimethylamine, dodecyldimethylamine and octyldimethylamine. Substantially the same curves were obtained in the cases of docosyldimethylamine, octadecyldimethylamine and hexadecyldimethylamine, but the collapse pressure became smaller in this order. FIG. 8 shows a case wherein hexadecylamine was employed. The surface area is smaller corresponding to the absence of the dimethyl group, but the film had an excellent quality.

EXAMPLE 3

1.00 g (5 mmol) of 4,4'-oxydianiline was dissolved in 20 ml of N,N-dimethylacetamide, and 1.61 g (5 mmol) of 3,3', 4,4'-benzophenonetetracarboxylic dianhydride was added thereto. The solution thus obtained was stirred at 12–°15° C. for one hour and at 20–°25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 0.73. Then, 0.4 ml of the polyamic acid solution was diluted with 49.6 ml of N,N-dimethylacetamide amide and 50.0 ml of benzene to obtain a solution for the preparation of a monomolecular film. The concentration of this solution was 1 mmol/liter.

Figure 9:
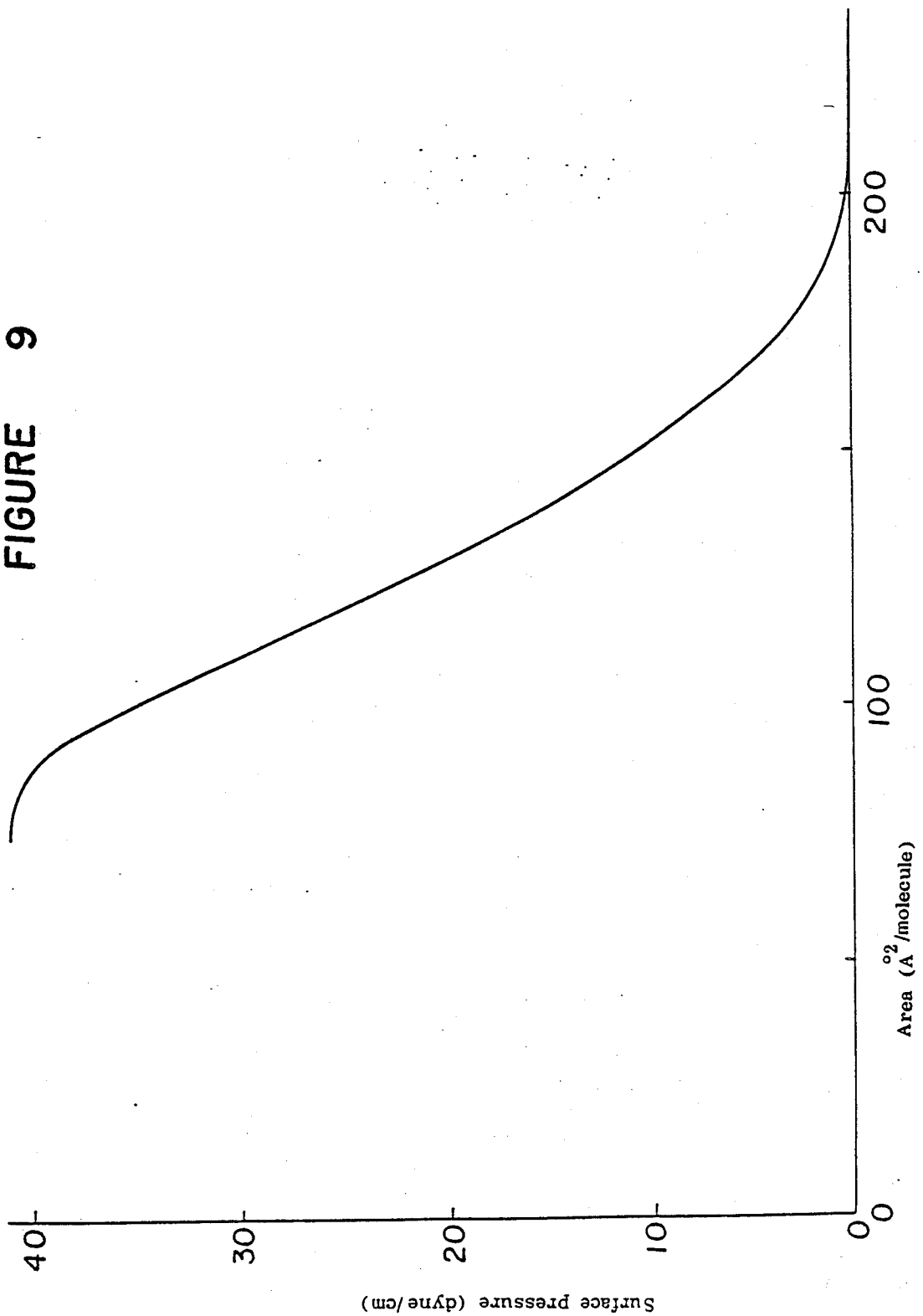

0.3 ml of the polyamic acid solution prepared in the above step was mixed with 0.6 ml of a solution (1 mmol/liter) of hexadecyldimethylamine in a 1:1 mixture of benzene and N,N-dimethylacetamide. Then, 100 microliter of this solution was spread on the surface of pure water. The surface pressure-area curve of the monomolecular film of the polyamic acid derivative thus obtained, is shown in FIG. 9.

EXAMPLE 4

4.7 g of 4,4'-diaminodiphenyl ether (ODA) and 5.0 g of 3,3'-dimethylbenzidine (OTD) were accurately weighed, and 80 ml of N,N-dimethylacetamide was added and dissolved. Then, 10.3 g of pyromellitic dianhydride was added thereto, and the reaction was conducted at room temperature for 5 hours. As the reaction proceeded, the viscosity of the solution increased. Therefore, the solution was diluted with N,N-dimethylacetamide to finally obtain a polyamic acid solution containing 12% by weight of OTD/ODA =50/50 (molar ratio).

Figure 10:
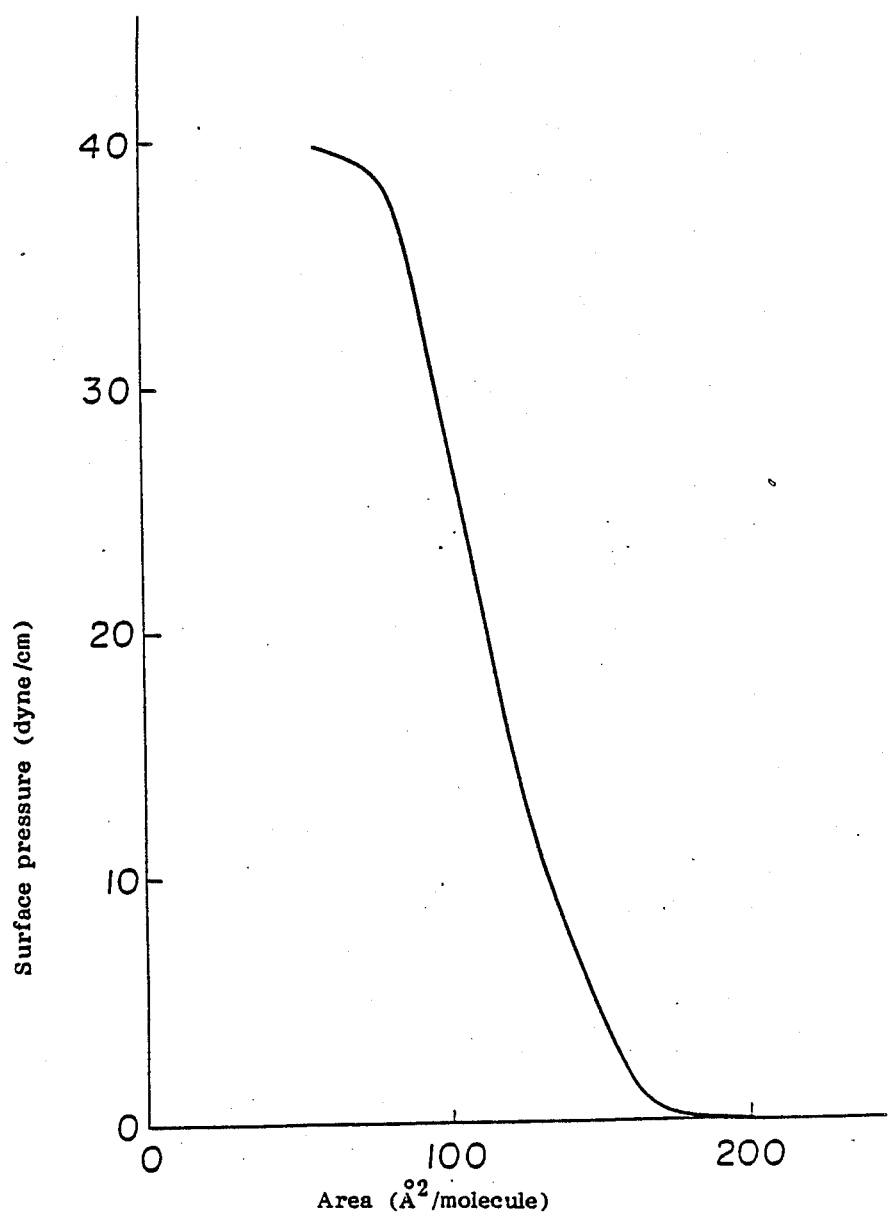

The above polyamic acid solution was mixed with hexadecyldimethylamine in a molar ratio of 1:2, and a surface pressure-area curve was obtained under the same conditions as in Example 1. The results are shown in FIG. 10.

EXAMPLE 5

1.99 g (5 mmol) of 2,5-bis(4-aminophenyl)-3,4-diphenylthiophene was dissolved in 20 ml of N,N-dimethylacetamide, and 1.09 g (5 mmol) of pyromellitic dianhydride was added thereto. This solution was stirred at 12°–15° C. for one hour and at 20°–25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 1.55. Then, 0.4 ml of the polyamic acid solution was diluted with 49.6 ml of N,N- dimethylacetamide and 50.0 ml of benzene to obtain a solution for the preparation of a monomolecular film. The concentration of this solution was 1 mmol/liter.

Figure 11:
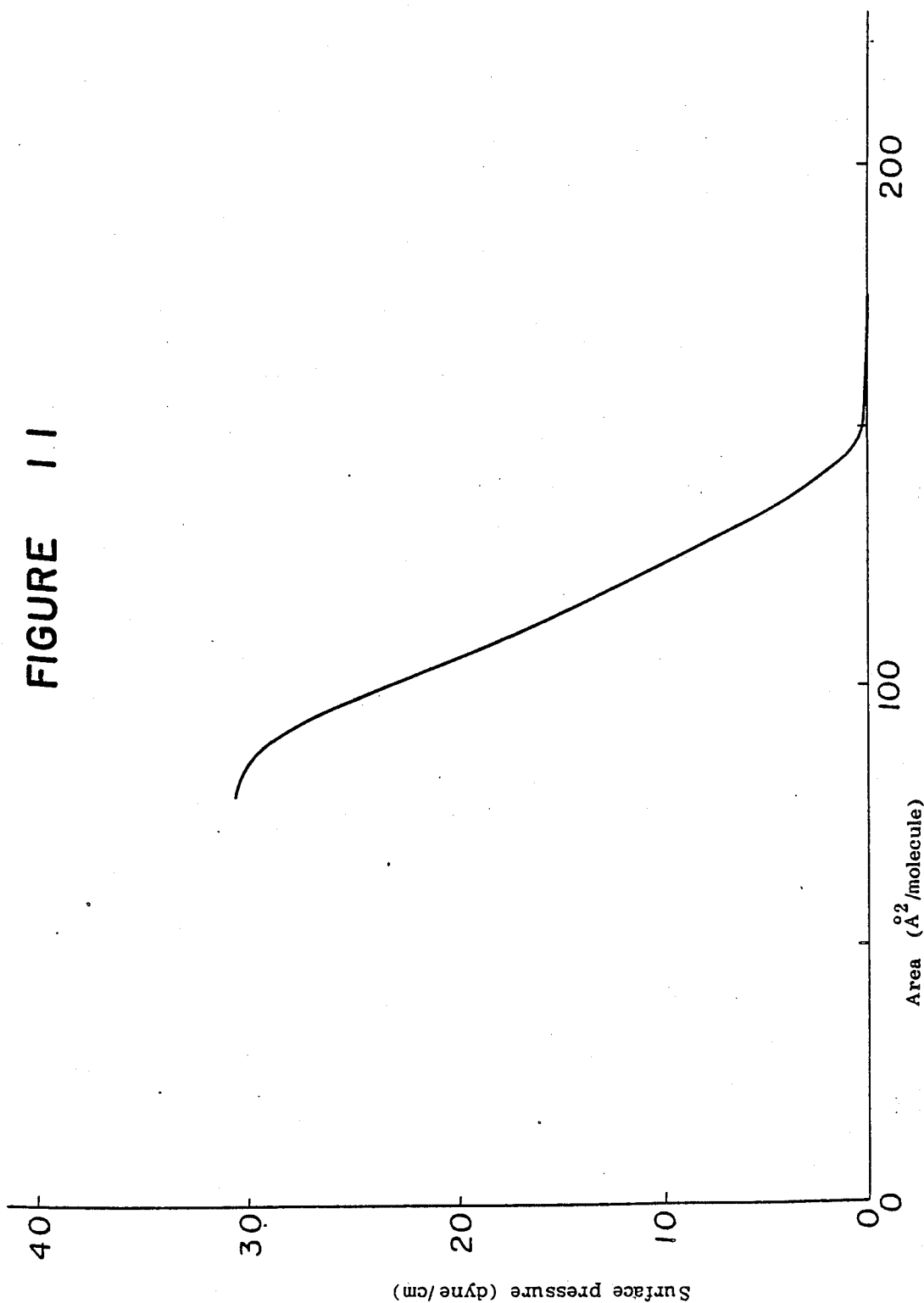

0.3 ml of the polyamic acid solution prepared in the above step, was mixed with 0.6 ml of a solution (1 mmol/liter) of hexadecyldimethylamine in a 1:1 mixture of benzene and N,N-dimethylacetamide. Then, 100 microliter of this solution was spread on the surface of pure water. The surface pressure-area curve of the monomolecular film of the polyamic acid thus obtained, is shown in FIG. 11.

EXAMPLE 6

1.99 g (5 mmol) of 2,5-bis(4-aminophenyl)-3,4-diphenylthiophene was dissolved in 20 ml of N,N-dimethylacetamide, and 1.61 g (5 mmol) of 3,3', 4,4'-benzophenonetetracarboxylic acid dianhydride was added thereto. This solution was stirred at 12°–15° C. for one hour and at 20°–25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 1.20. Then, 0.4. ml of the polyamic acid solution was diluted with 49.6 ml of N,N-dimethylacetamide and 50.0 ml of benzene to obtain a solution for the preparation of a monomolecular film. The concentration of this solution was 1 mmol/liter.

Figure 12:
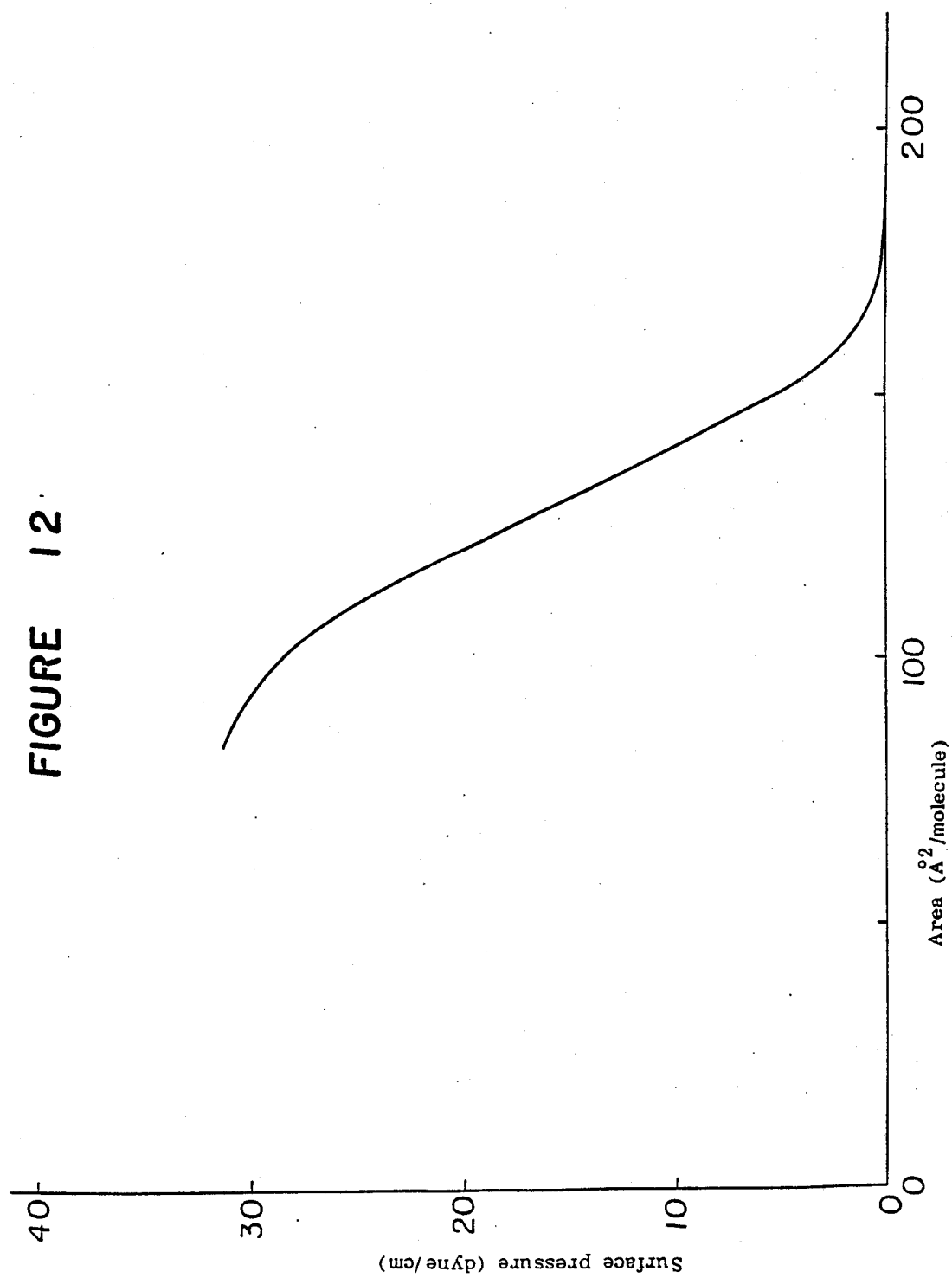

0.3 ml of the polyamic acid solution prepared in the above step, was mixed with 0.6 ml of a solution (1 mmol/liter) of hexadecyl dimethylamine in a 1:1 mixture of benzene and N,N-dimethylacetamide. Then, 100 microliter of this solution was spread on the surface of pure water. The surface pressure-area curve of the monomolecular film of the polyamic acid derivative thus obtained, is shown in FIG. 12.

EXAMPLE 7

0.54 g (5 mmol) of p-phenylenediamine was dissolved in 20 ml of N,N-dimethylacetamide, and 1.47 g (5 mmol) of 3,3', 4,4'-biphenyltetracarboxylic dianhydride was added thereto. This solution was stirred at 12°–15° C. for one hour and at 20°–25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and was found to be 0.44. Then, 0.4 ml of the polyamic acid solution was diluted with 49.6 ml of N,N-dimethylacetamide and 50.0 ml of benzene to obtain a solution for the preparation of a monomolecular film. The concentration of this solution was 1 mmol/liter.

Figure 13:
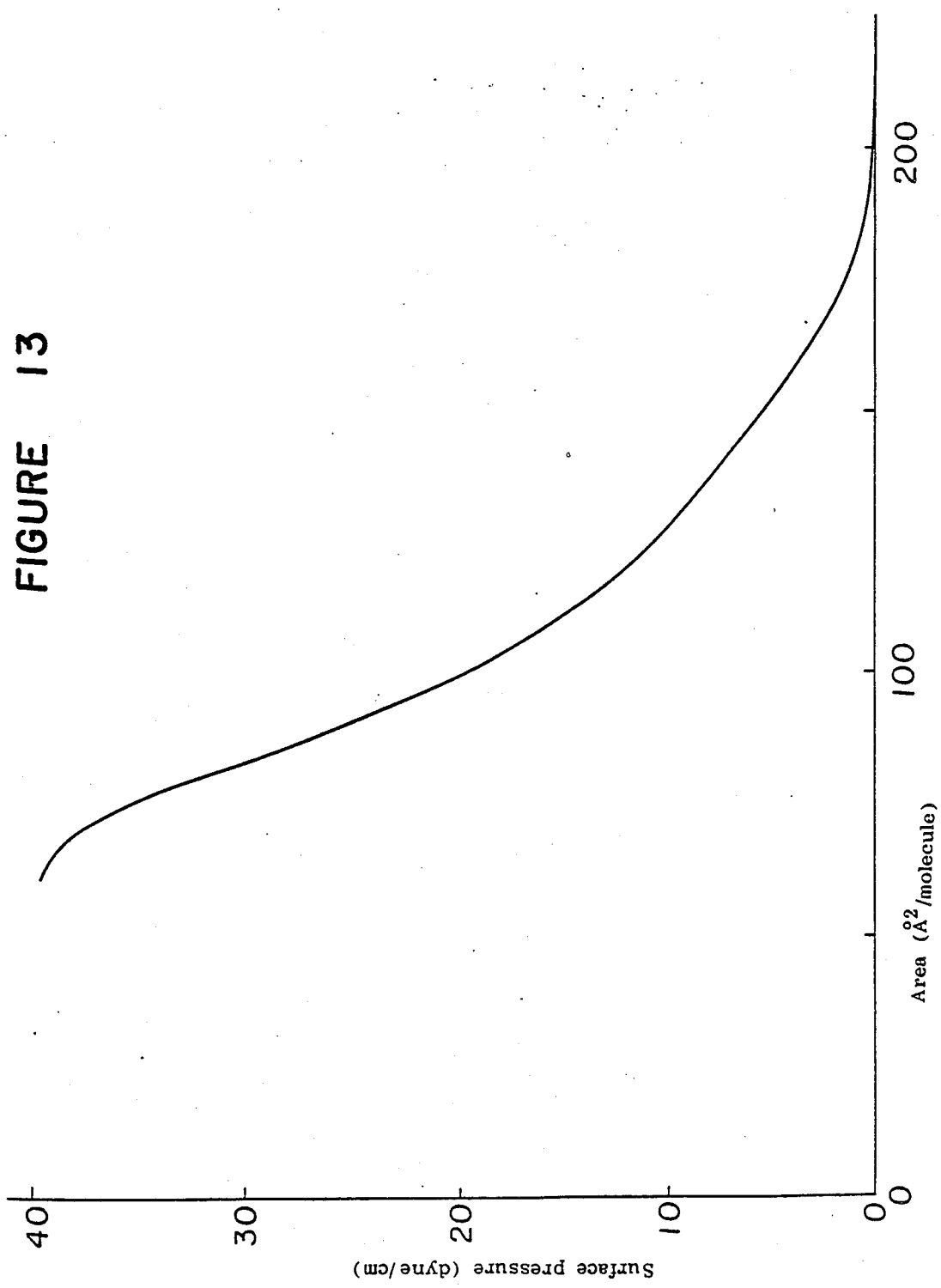

0.3 ml of the polyamic acid solution prepared in the above step, was mixed with 0.6 ml of a solution (1 mmol/liter) of hexadecyldimethylamine in a 1:1 mixture of benzene and N,N-dimethylacetamide. Then, 100 microliter of this solution was spread on the surface of a pure water. The surface pressure-area curve of the monomolecular film of the polyamic acid derivative thus obtained, is shown in FIG. 13.

EXAMPLE 8

1.00 g (5 mmol) of 4,4'-oxydianiline was dissolved in 20 ml of N,N-dimethylacetamide, and 1.47 g (5 mmol) of 3,3', 4,4'-biphenyltetracarboxylic dianhydride was added thereto. This solution was stirred at 12°–15° C. for one hour and at 20°–25° C. for 1.5 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 0.69. Then, 0.4 ml of the polyamic acid solution was diluted with 49.6 ml of N,N-dimethylacetamide and 50.0 ml of benzene to obtain a solution for the preparation of a monomolecular film. The concentration of this solution was 1 mmol/liter.

Figure 14:
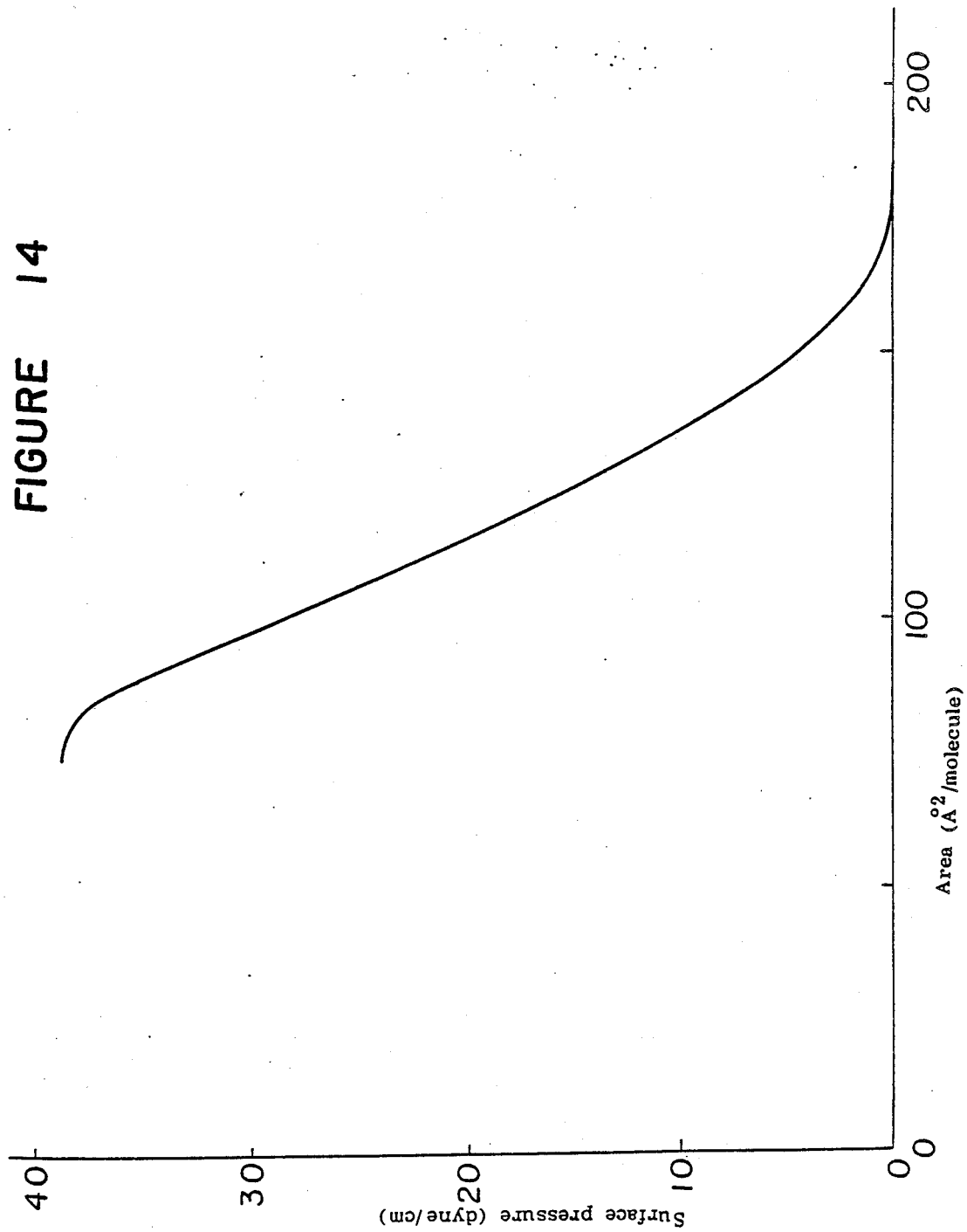

0.3 ml of the polyamic acid solution prepared in the above step, was mixed with 0.6 ml of a solution (1 mmol/liter) of hexadecyldimethylamine in a 1:1 mixture of benzene and N,N-dimethylacetamide. Then, 100 microliter of this solution was spread on the surface of pure water. The surface pressure-area curve of the monomolecular film of the polyamic acid derivative thus obtained, is shown in FIG. 14.

EXAMPLE 9

Preparation of a polyamic acid solution:

0.54 g (5 mmol) of p-phenylenediamine was dissolved in 10 ml of N,N-dimethylacetamide, and 1.09 g (5 mmol) of pyromellitic dianhydride was added thereto. This solution was stirred at 12°–15° C. for one hour and at 20°–25° C. for 10 hours to obtain a solution of a polyamic acid. A part of the solution was poured into a large amount of methanol to obtain a solid of the polyamic acid, the inherent viscosity of which was measured in N,N-dimethylacetamide at 30° C. and found to be 0.67. Then, 0.2 ml of the polyamic acid solution was diluted with 49.8 ml of N,N-dimethylacetamide and 50.0 ml of benzene to obtain a solution for the preparation of a monomolecular film. The concentration of this solution was 1 mmol/liter.

Figure 15:
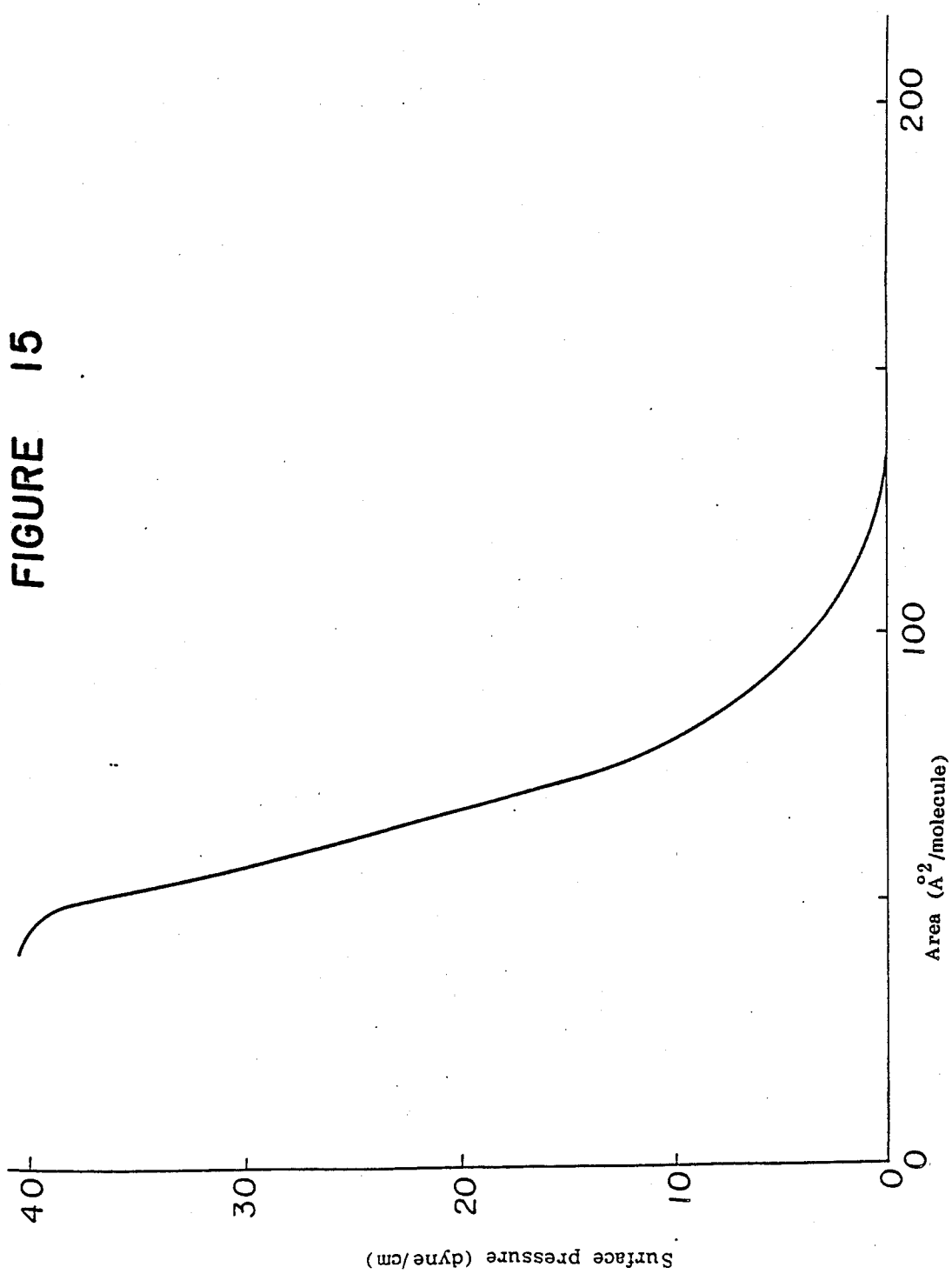
Figure 16:
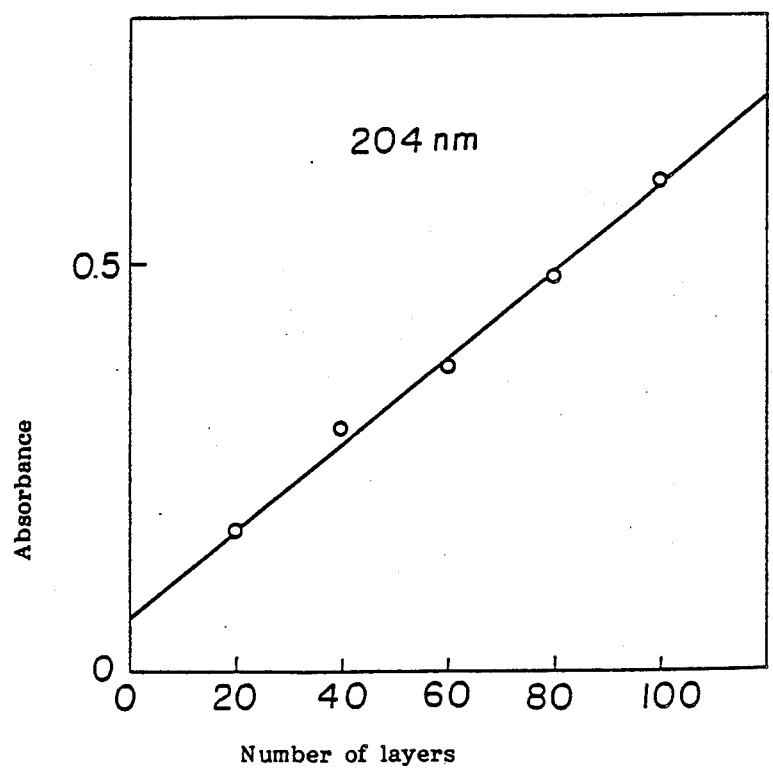

Preparation of a monomolecular film of the polyamic acid derivative:

0.3 ml of the polyamic acid solution prepared in the above step, was mixed with 0.6 ml of a solution (1 mmol/liter) of hexadecyldimethylamine in a 1:1 mixture of benzene and N,N-dimethylacetamide. Then, 100 microliter of this solution was spread on the surface of pure water. The surface pressure-area curve of the monomolecular film of the polyamic acid derivative thus obtained, is shown in FIG. 15. Then, the thin film on the water surface was deposited on a quartz plate at a surface pressure of 25 dyne/cm by a vertical dipping method. FIG. 16 shows the relation between the number of layers of the monomolecular weight film of the polyamic acid derivative deposited on the quartz plate and the absorbance at 204 nm. This graph shows a linear relationship, which indicates that the deposition or building-up was excellent. In the scanning electron microscopic photograph of a thin film of 20 layers deposited on a glass plate, no distinct cracks or voids have been observed. FIG. 17 shows the transmission FT-IR absorption spectrum of the polyamic acid derivative deposited on a calcium fluoride plate.

Preparation of a monomolecular weight built-up film of a polyimide:

The quartz plate on which the polyamic acid derivative was deposited in the proceeding step, was immersed for 12 hours in a solution consisting of acetic anhydride, pyridine and benzene in a ratio of 1:1:3. As shown in FIG. 18, the number of layers and the absorbance at 226 nm are in a linear relationship, which indicates that the built-up structure of the polyamic acid derivative multiple layer film prepared in the above step is reflected directly to this polyimide multiple layer film. This indicates that the polyamic acid derivative built-up film was converted to the polyimide built-up film, and no peeling of the film occured during the process. FIG. 19 shows the transmission FT-IR absorption spectrum of the polyimide deposited on a calcium fluoride plate. With the polyimide multiple layer film obtained from the polyamic acid derivative built-up film used for the scanning electron microscopic inspection in the previous step, no distinct cracks or voids were observed from the scanning electron microscopic photograph. From the results of the inspection by the X-ray diffraction, the interlayer distance was about 2.6 Å. The thickness of the polyimide multiple layer film of 100 layers was measured by a feeler method and found to be 250 Å, which was the same as the value obtained from the X-ray diffraction.

Then, in the same manner as mentioned above, a polyimide monomolecular film was deposited on a substrate obtained by vapor depositing aluminum on a glass plate, and aluminum was further vapor-deposited as an upper electrode, whereupon the electric capacitance of the polyimide multiple layer film was measured. The results are shown in FIG. 20, which indicates that the number of layers and the reciprocal of the electric capacitance are in a proportional relationship, and the number of layers and the film thickness are proportional. Further, from the slope, the dielectric constant is obtainable. When 2.6 Å. A obtained from the X-ray diffraction is used as the film thickness, the dielectric constant is calculated to be 3.6.

The polyimide a film comprised of at least one monomolecular layer prepared by the present invention, are far thinner and uniform than the polyimide thin films prepared by conventional processes. Such monomolecular films or multiple layer films are useful for application to electronic parts such as semiconductor elements or permselective membranes for separation of e.g. hydrogen gas. Thus, their industrial value is high.

What is claimed is:

1. A process for preparing a film comprised of at least one monomolecular layer composed essentially of a polyimide having repeating units of the formula:

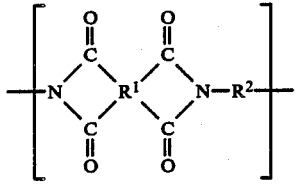

wherein $R^1$ is a tetravalent organic group, and $R^2$ is a bivalent organic group, which comprises spreading on a water surface an organic solvent solution of a polyamic acid and an amine having a higher alkyl group, forming on a substrate a monomolecular film or monomolecular built-up film of the polyamic acid derivative, and then treating the film for conversion to a polyimide.

2. The process according to claim 1, wherein the polyamic acid has the formula:

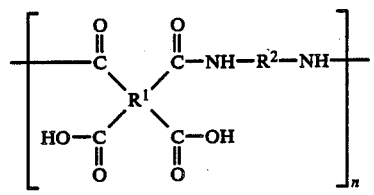

wherein $R^1$ and $R^2$ are as defined above and n is an integer of at least 10, and the amine has the formula:

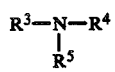

wherein each of $R^3$, $R^4$ and $R^5$ is a hydrogen atom or an organic group, provided that two of them may, together with the adjacent nitrogen atom, form a cyclic ring, and at least one of them is a higher alkyl group.

3. The process according to claim 2, wherein in the formula I, $R^1$ is selected from the group consisting of

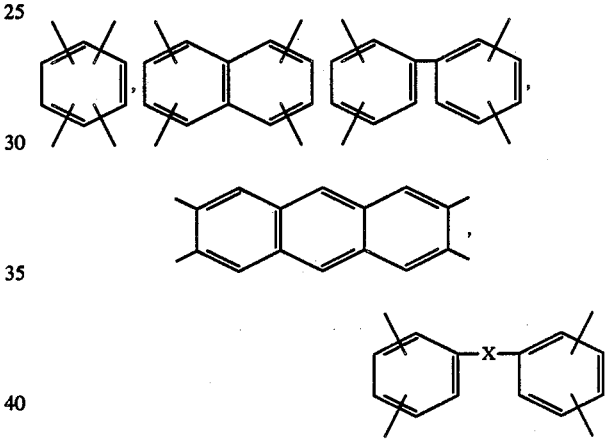

wherein X is a bivalent group selected from the group consisting of

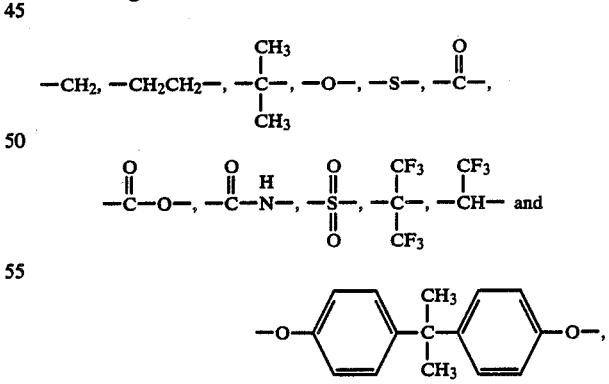

and $R^2$ is selected from the group consisting of phenylene, naphthylene, biphenylene and a biphenylene derivative wherein the two phenylene groups are connected by a bivalent group X as defined above, and in the formula II, each of $R^3$, $R^4$ and $R^5$ is a hydrogen atom or an alkyl, alkenyl or alkynyl group, provided that two of them may, together with the adjacent nitrogen atom, form a 3- to 7-membered cyclic ring, and at least one of them is an alkyl group having from 8 to 40 carbon atoms.

4. The process according to claim 1, wherein the organic solvent for the organic solvent solution is selected from the group consisting of hexane, octane, benzene, toluene, xylene, dichloromethane, chloroform, carbon tetrachloride, diethyl ether and dibutyl ether.

5. The process according to claim 1, wherein the amine in the organic solvent solution is present in an amount of at least ½ mol relative to the polyamic acid.

6. The process according to claim 1, wherein the treatment for conversion to a polyimide is conducted by dipping the film formed on the substrate in an organic solvent solution of a carboxylic acid anhydride.

7. The process according to claim 6, wherein the carboxylic acid anhydride is acetic anhydride, propionic anhydride or butyric anhydride.

8. The process according to claim 2, wherein the polyamic acid of the formula I is prepared by polymerizing a tetracarboxylic acid dianhydride of the formula:

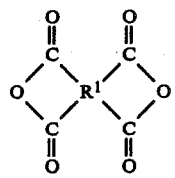 (III)

wherein $R^1$ is as defined above, with a diamine of the formula:

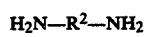

wherein $R^2$ is as defined above.

* * * * *